United States Patent
Sasaki et al.

(10) Patent No.: US 12,371,784 B2
(45) Date of Patent: Jul. 29, 2025

(54) GAS MANAGEMENT METHOD AND SUBSTRATE PROCESSING SYSTEM

(71) Applicant: Tokyo Electron Limited, Tokyo (JP)

(72) Inventors: Koji Sasaki, Yamanashi (JP); Yuji Seshimo, Yamanashi (JP); Katsuyuki Higashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/944,625

(22) Filed: Sep. 14, 2022

(65) Prior Publication Data

US 2023/0096797 A1 Mar. 30, 2023

(30) Foreign Application Priority Data

Sep. 24, 2021 (JP) .................................. 2021-155346

(51) Int. Cl.
*C23C 16/448* (2006.01)
*C23C 16/52* (2006.01)

(52) U.S. Cl.
CPC ............ *C23C 16/448* (2013.01); *C23C 16/52* (2013.01)

(58) Field of Classification Search
None
See application file for complete search history.

(56) References Cited

U.S. PATENT DOCUMENTS

| | | | |
|---|---|---|---|
| 5,348,774 A | * | 9/1994 | Golecki ................ C04B 35/521 427/255.6 |
| 2016/0005632 A1 | * | 1/2016 | Nishimura .............. C23C 16/52 438/5 |
| 2016/0090651 A1 | * | 3/2016 | Ashihara ........... C23C 16/45561 118/712 |
| 2016/0281226 A1 | * | 9/2016 | Moroi ..................... C23C 16/08 |
| 2018/0204742 A1 | * | 7/2018 | Tateno .............. H01L 21/67017 |
| 2019/0177840 A1 | * | 6/2019 | Eldridge ............. C23C 16/4487 |

FOREIGN PATENT DOCUMENTS

| | | | |
|---|---|---|---|
| CN | 113029070 | * | 6/2021 |
| JP | 2003332239 | * | 11/2003 |
| JP | 6419581 B2 | | 11/2018 |
| KR | 20190090406 | * | 8/2019 |

* cited by examiner

*Primary Examiner* — Mandy C Louie
(74) *Attorney, Agent, or Firm* — Venjuris, P.C.

(57) ABSTRACT

A gas management method includes: heating a raw material container that accommodates a raw material, by a heater, thereby generating a vaporized raw material gas; supplying the vaporized raw material gas together with a carrier gas to a processing container that accommodates a substrate, thereby performing a processing on the substrate; and controlling the heater based on a weight of the substrate after the processing on the substrate.

7 Claims, 5 Drawing Sheets

GAS MANAGEMENT METHOD AND SUBSTRATE PROCESSING SYSTEM

CROSS-REFERENCE TO RELATED APPLICATIONS

This application is based on and claims priority from Japanese Patent Application No. 2021-155346, filed on Sep. 24, 2021 with the Japan Patent Office, the disclosure of which is incorporated herein in its entirety by reference.

TECHNICAL FIELD

The present disclosure relates to a gas management method and a substrate processing system.

BACKGROUND

A substrate processing system has been known, in which a raw material container that accommodates a solid raw material therein is heated by a heater and a vaporized raw material gas is supplied, together with a carrier gas, to a substrate processing apparatus, thereby performing a film forming processing on a substrate. Further, Japanese Patent No. 6419581 describes obtaining the weight difference between the weight of a substrate before exposure and the weight of the substrate after exposure, and obtaining the film thickness of a contamination film generated by an exposure processing based on the weight difference.

SUMMARY

In order to address the above problem, according to an aspect of the present disclosure, a gas management method heating a raw material container that accommodates a raw material, by a heater, thereby generating a vaporized raw material gas; supplying the vaporized raw material gas together with a carrier gas to a processing container that accommodates a substrate, thereby performing a processing on the substrate; and controlling the heater based on a weight of the substrate after the processing on the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
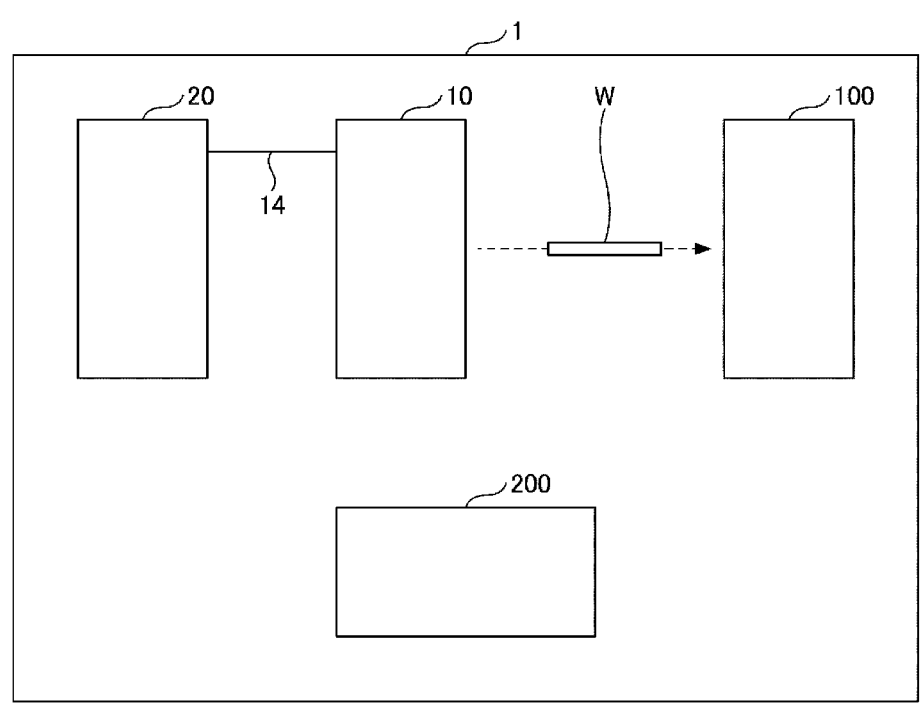
FIG. 1 is an example of a configuration diagram illustrating a configuration of a substrate processing system according to the present embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the drawings. In each drawing, the same components will be designated by the same reference numerals, and redundant descriptions may be omitted.

FIG. 1 is an example of a configuration diagram illustrating a configuration of a substrate processing system 1 according to the present embodiment.

The substrate processing system 1 includes a substrate processing apparatus 10, a raw material supply apparatus 20, a wafer weight measuring apparatus 100, and a control unit 200.

The substrate processing apparatus 10 is a film forming apparatus that performs a film forming processing on a semiconductor wafer (hereinafter simply referred to as a wafer W), which is an example of a substrate. The raw material supply apparatus 20 supplies a raw material gas for use in the film forming processing to the substrate processing apparatus 10 through a supply path 14.

The wafer weight measuring apparatus 100 measures the weight of the wafer W subjected to film forming processing in the substrate processing apparatus 10. Further, the wafer weight measuring apparatus 100 measures the weight of the wafer W before the film forming processing is performed in the substrate processing apparatus 10.

The control unit 200 controls the substrate processing apparatus 10, the raw material supply apparatus 20, and the wafer weight measuring apparatus 100.

The wafer weight measuring apparatus 100 may be provided outside the substrate processing system 1. In this configuration, measurement data of the wafer weight measuring apparatus 100 may be input to the control unit 200 directly or via a signal line.

Figure 2:
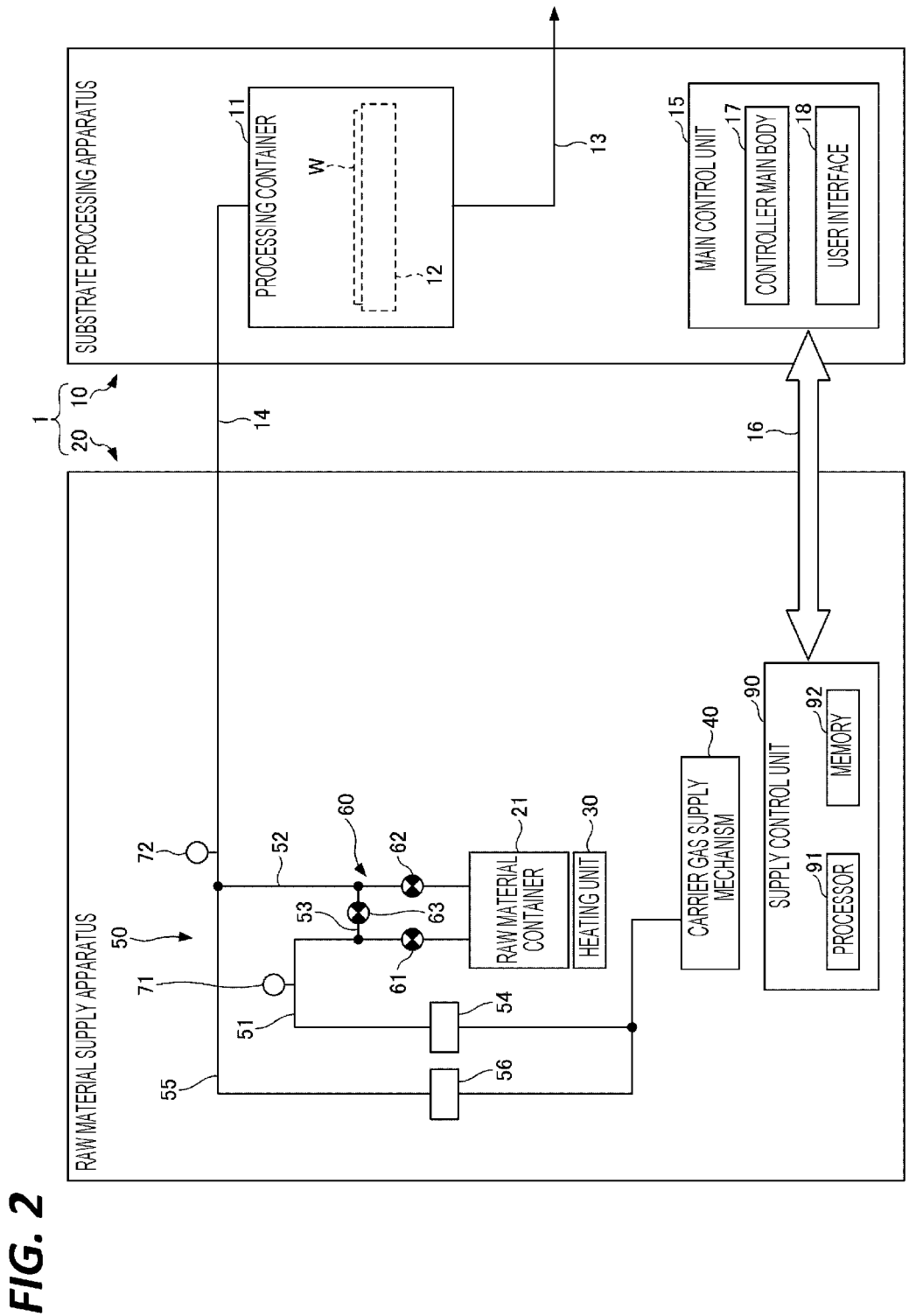
FIG. 2 is a schematic explanatory diagram illustrating a configuration of a substrate processing apparatus and a raw material supply apparatus.

FIG. 2 is a schematic explanatory diagram illustrating a configuration of the substrate processing apparatus 10 and the raw material supply apparatus 20.

The substrate processing apparatus 10 is a semiconductor manufacturing apparatus such as a film forming apparatus. The substrate processing apparatus 10 includes a processing container 11 and a main control unit 15. For example, when the substrate processing apparatus 10 is a film forming apparatus, the wafer W accommodated in the processing container 11 is subjected to a film forming processing.

The processing container 11 is made of an aluminum alloy or the like and has a cylindrical shape. A sidewall of the processing container 11 is formed with an opening for loading or unloading the wafer W into or from the processing container 11, and the opening is provided with a gate valve for opening and closing the opening (all of which are not illustrated). Further, a stage 12 on which the wafer W is placed is provided inside the processing container 11. The stage 12 includes a chuck device that secures the wafer W and a temperature adjustor that adjusts the temperature of the wafer W (all of which are not illustrated).

The processing container 11 is connected to an exhaust path 13 through which a gas in the processing container 11 is discharged. The exhaust path 13 is provided with a pressure regulating valve, a vacuum pump, and the like (all of which are not illustrated). Further, the processing container 11 is connected to one end of a supply path 14 through which the gas is supplied. The other end of the supply path 14 is connected to the raw material supply apparatus 20. That is, the processing container 11 of the substrate processing apparatus 10 and the raw material supply apparatus 20 communicate with each other through the supply path 14.

The raw material supply apparatus 20 includes raw material containers 21. Further, the raw material supply apparatus 20 includes a heater 30 that heats the raw material containers 21, a carrier gas supply mechanism 40 that supplies a carrier gas to each raw material container 21, and a supply control unit 90 that controls each component of the raw material supply apparatus 20. The supply path 14, each raw material container 21, and the carrier gas supply mechanism 40 are connected to one another by a plurality of gas paths 50. Furthermore, the raw material supply apparatus 20 includes a plurality of opening/closing valves 60 in the gas paths 50 around the raw material container 21.

Figure 3:
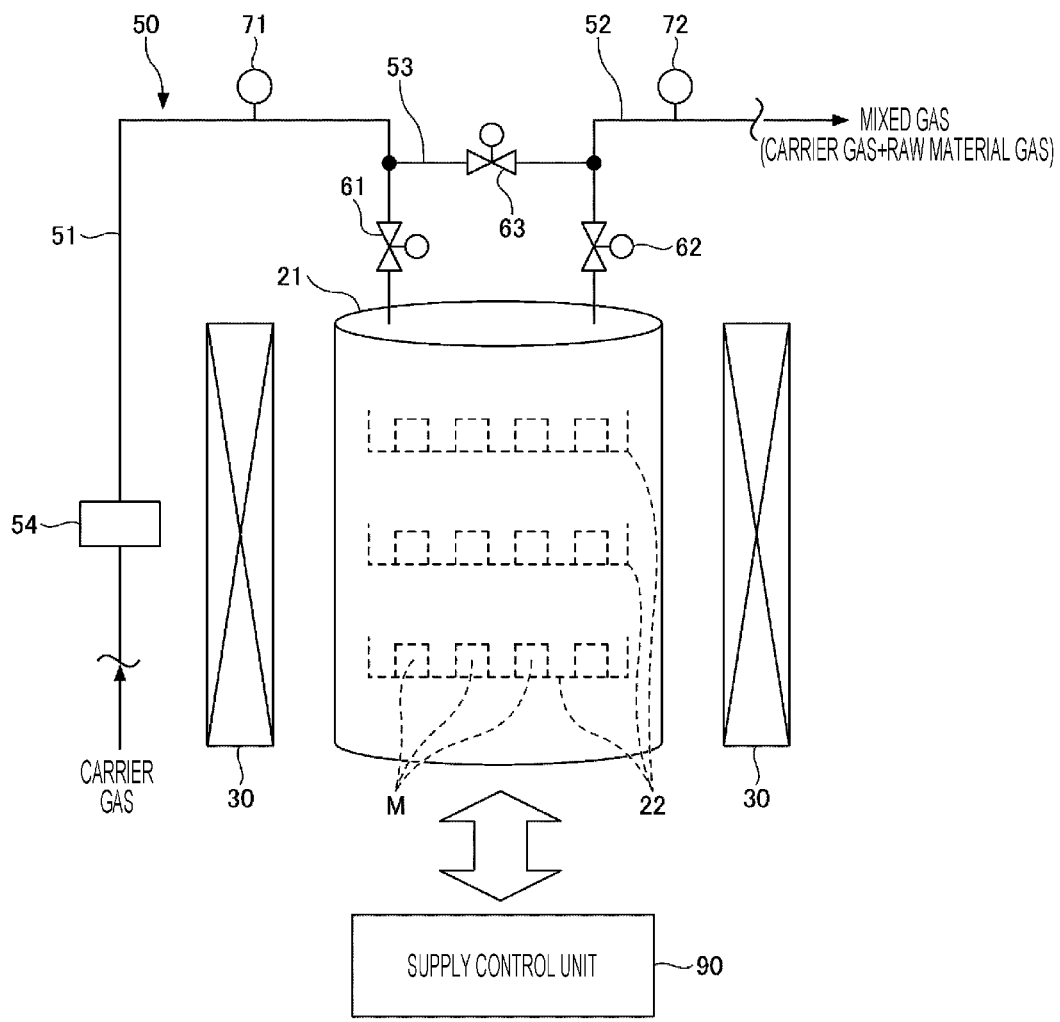
FIG. 3 is a schematic explanatory diagram illustrating a configuration of a raw material container and the surroundings thereof.

FIG. 3 is a schematic explanatory diagram illustrating a configuration of the raw material container 21 and the surroundings thereof. As illustrated in FIGS. 2 and 3, the raw material container 21 accommodates a plurality of raw materials M in advance therein. A tank capable of vaporizing (sublimating) the raw materials M by heating of the heater 30 may be applied as the raw material container 21. The raw material M in the raw material container 21 is a solid raw material or a liquid raw material. The raw material M in the raw material container 21 is not particularly limited, but examples thereof may include a chloride compound such as aluminum chloride ($AlCl_3$) or copper chloride (AlCu). Alternatively, the raw material M may be an organic metal such as Si, Hf, Ta, Zr, Al, Ti, Zn, In, Ga, or P, or any other solid raw materials or liquid raw materials. In the present embodiment, descriptions will be made on a case where aluminum chloride is used as the solid raw material M. The term "vaporization" in the present embodiment is an expression containing the concept of sublimation of a raw material into a gas and the concept of evaporation of a liquid raw material into a gas.

Although FIG. 1 illustrates an example with one raw material container 21, the raw material supply apparatus 20 may include two or more raw material containers 21.

As illustrated in FIG. 3, the raw material container 21 is formed in the shape of a cylinder or square vessel extending along the vertical direction. A plurality of trays 22 are provided at approximately equal intervals along the vertical direction within the raw material container 21. One or a plurality of raw materials M are placed in each tray 22.

The raw material container 21 is made of a material with high thermal conductivity (e.g., alumina) The heater 30 that heats the raw material container 21 is provided outside the raw material container 21 or on a peripheral wall of the container. The heater 30 heats the raw material M in the raw material container 21 based on the control of the supply control unit 90. For example, an electric heater such as a sheathed heater or a hand heater may be applied as the heater 30.

The carrier gas supply mechanism 40 supplies a carrier gas to the gas path 50 connected to the raw material container 21. An example of the carrier gas may include an inert gas such as argon gas (Ar gas), helium gas (He gas), or nitrogen gas ($N_2$ gas). For example, the carrier gas supply mechanism 40 includes a carrier gas source, a regulator that reduces the pressure of the carrier gas sent from the source, and a valve that opens or closes the flow path of each gas path 50 (all of which are not illustrated).

The gas paths 50 include an upstream path 51 that connects the carrier gas supply mechanism 40 and the raw material container 21 to each other, a downstream path 52 that connects the raw material container 21 and the supply path 14 to each other, and a bypass path 53 that bypasses the raw material container 21. That is, the raw material supply apparatus 20 forms a primary side at which the carrier gas is introduced into the raw material container 21 through the upstream path 51, and forms a secondary side at which the vaporized raw material gas is discharged together with the carrier gas through the downstream path 52. The bypass path 53 connects the upstream path 51 and the downstream path 52 to each other.

The opening/closing valves 60 around the raw material container 21 include an upstream side valve 61 provided in the upstream path 51, a downstream side valve 62 provided in the downstream path 52, and a bypass side valve 63 provided in the bypass path 53. The upstream side valve 61 is provided downstream of the connection point of the bypass path 53 in the upstream path 51. The downstream side valve 62 is provided upstream of the connection point of the bypass path 53 in the downstream path 52.

Each opening/closing valve 60 is connected to the supply control unit 90 and opens (fully opens) and closes (fully closes) the flow path of each path based on the control of the supply control unit 90. Each opening/closing valve 60 allows a gas to flow through the flow path in the opened state thereof, and blocks the flow of the gas in the flow path in the closed state thereof.

Further, the upstream path 51 includes a mass flow controller 54 and an upstream side pressure gauge 71 in addition to the upstream side valve 61. The upstream path 51 may include a safety valve, a constant pressure valve, a filter, a heater, and the like.

The mass flow controller 54 is provided on an upstream side of the connection point of the bypass path 53 (the carrier gas supply mechanism 40 side) in the upstream path 51 and is connected to the supply control unit 90. The mass flow controller 54 adjusts the flow rate of the carrier gas supplied from the carrier gas supply mechanism 40 to the raw material container 21 under the control of the supply control unit 90.

The upstream side pressure gauge 71 is provided between the mass flow controller 54 and the upstream side valve 61 (and the connection point of the bypass path 53). The upstream side pressure gauge 71 detects the internal pressure (the pressure of the carrier gas) in the flow path of piping that constitutes the upstream path 51 and transmits information on the detected pressure value to the supply control unit 90. Various detectors capable of detecting the total pressure (static pressure and dynamic pressure) may be applied to the upstream side pressure gauge 71. The upstream side pressure gauge 71 may be provided in the upstream path 51 upstream of the mass flow controller 54.

The downstream path 52 includes a downstream side pressure gauge 72 in addition to the downstream side valve 62. The downstream side pressure gauge 72 is provided downstream of the downstream side valve 62 (and the connection point of the bypass path 53). The downstream side pressure gauge 72 detects the internal pressure (the pressure of the carrier gas and the raw material gas) in the flow path of piping that constitutes the downstream path 52 and transmits information on the detected pressure value to the supply control unit 90.

Referring back to FIG. 2, the gas paths 50 of the raw material supply apparatus 20 further include a first branch path 55 branching off from the upstream path 51. The other end of the first branch path 55 is connected to the downstream path 52 between the downstream side valve 62 and the downstream side pressure gauge 72. A mass flow controller 56 is provided at the intermediate position of the first branch path 55. The mass flow controller 56 adjusts the flow rate of the carrier gas flowing from the upstream path 51 to the downstream path 52 through the first branch path 55.

The substrate processing system 1 having the substrate processing apparatus 10 and the raw material supply apparatus 20 described above controls an operation of the entire system by the main control unit 15 of the substrate processing apparatus 10. The supply control unit 90 of the raw material supply apparatus 20 is connected to the main control unit 15 via an appropriate communication unit 16, and operates based on commands from the main control unit 15 to control an operation of the raw material supply apparatus 20. The communication unit 16 may employ either wired communication or wireless communication, and may be configured to directly interconnect the control units, or may be configured using a network such as a local area network (LAN). The substrate processing system 1 may be configured such that the main control unit 15 has the function of the supply control unit 90, and, thus, may not include the supply control unit 90.

The main control unit 15 includes a controller main body 17 that controls the entire substrate processing system 1 and a user interface 18 connected to the controller main body 17. The controller main body 17 and the supply control unit 90 are configured by a computer, a control circuit board, or the like.

For example, the controller main body 17 includes a processor, a memory, an input/output interface, and an electronic circuit (all of which are not illustrated). The controller main body 17 transmits and receives various signals to and from each component of the substrate processing system 1 to perform a substrate processing as the processor executes a program recorded in the memory.

The user interface 18 may employ, for example, a keyboard by which a user performs the input of commands or the like, and a display on which the operating status of the substrate processing system 1 is visualized and displayed. Alternatively, the user interface 18 may employ other devices such as a touch panel, a mouse, a microphone, and a speaker.

Further, the supply control unit 90 includes one or more processors 91, a memory 92, an input/output interface (not illustrated), and an electronic circuit (not illustrated). The processor 91 is a combination of one or more of a CPU, an ASIC, an FPGA, a circuit including a plurality of discrete semiconductors, and the like. The memory 92 includes a volatile memory and a nonvolatile memory (e.g., a compact disc, a DVD, a hard disk, and a flash memory), and stores recipes such as programs and process conditions for operating the raw material supply apparatus 20.

The supply control unit 90 transmits and receives various signals to and from each component of the raw material supply apparatus 20 to supply a gas to the substrate processing apparatus 10 as the processor 91 executes programs or recipes stored in the memory 92 based on commands from the main control unit 15.

When processing the wafer W, the main control unit 15 of the substrate processing apparatus 10 transmits a command for supplying the raw material gas to the processing container 11 to the supply control unit 90 at an appropriate timing (e.g., after the wafer W is completely placed on the stage 12 and the inside of the processing container 11 is decompressed). Upon receiving this supply command, the supply control unit 90 controls each component of the raw material supply apparatus 20 to initiate the supply of the raw material gas.

The supply control unit 90 operates the heater 30 to heat the raw material container 21 when the supply of the raw material gas is initiated (or after the raw material supply apparatus 20 is activated). Thus, the raw material M in the raw material container 21 is heated up to a temperature at which it is vaporizable. Further, the supply control unit 90 opens the upstream side valve 61 and the downstream side valve 62 and controls the mass flow controller 54 and the mass flow controller 56 to supply the mixed gas of the carrier gas and the raw material gas to the processing container 11. Thus, the wafer W is subjected to a film forming processing.

Figure 4:
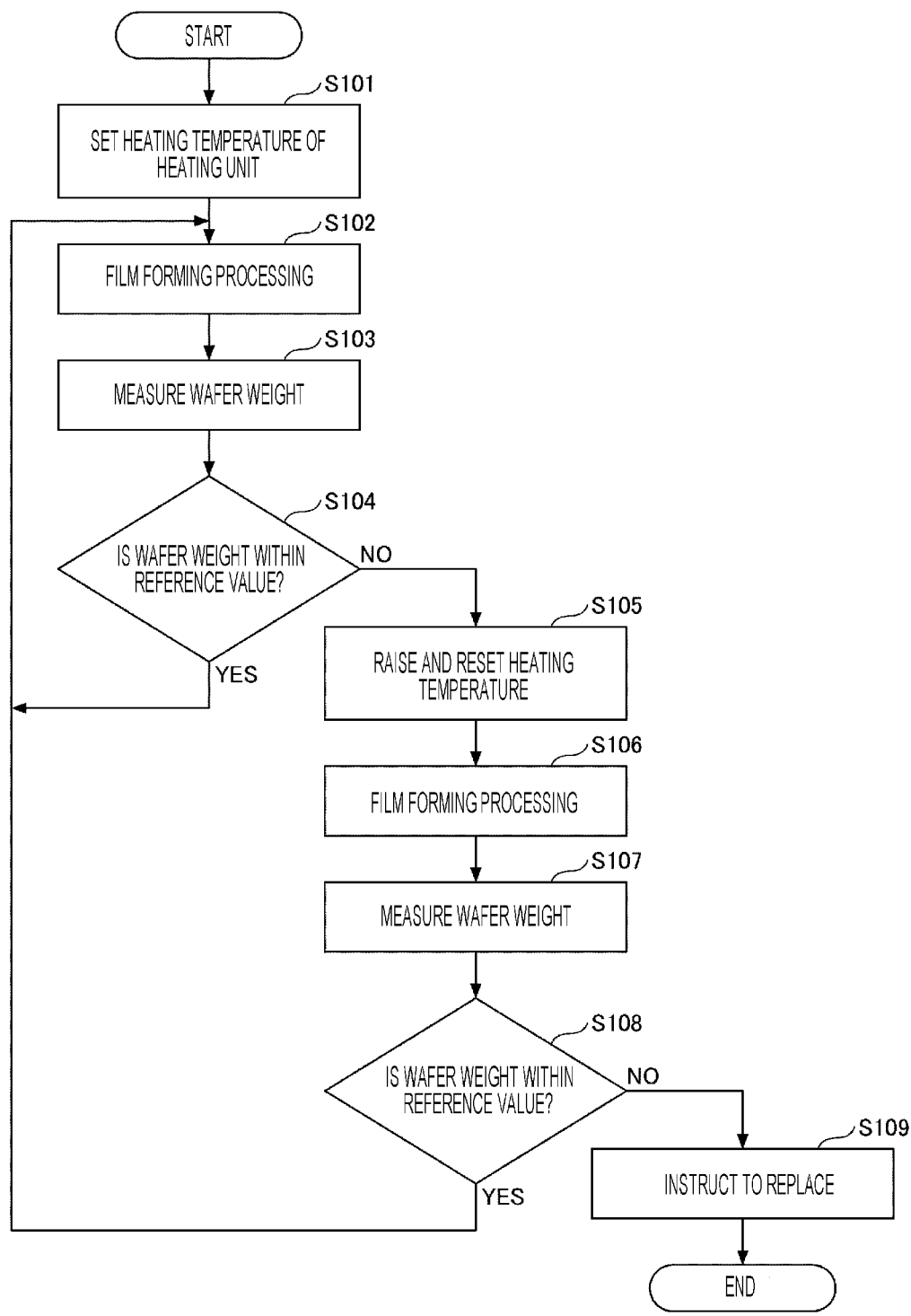
FIG. 4 is a flowchart illustrating a gas management method in the substrate processing system according to the present embodiment.

Next, a gas management method of the substrate processing system 1 according to the present embodiment will be described with reference to FIG. 4. FIG. 4 is a flowchart illustrating a gas management method in the substrate processing system 1 according to the present embodiment.

In step S101, the control unit 200 sets the set temperature (heating temperature) of the heater 30 to a predetermined set temperature.

In step S102, the control unit 200 performs a film forming processing on the wafer W. Specifically, the wafer W before the film forming processing is transported to the substrate processing apparatus 10 and is placed on the stage 12. The control unit 200 controls the heater 30 to the predetermined set temperature, and controls the upstream side valve 61, the downstream side valve 62, the mass flow controller 54, and the mass flow controller 56 to supply the mixed gas of the carrier gas and the raw material gas from the raw material supply apparatus 20 into the processing container 11. Thus, the wafer W is subjected to the film forming processing.

In step S103, the control unit 200 measures the weight of the wafer W subjected to the film forming processing in step S102. Specifically, the wafer W subjected to the film forming processings is unloaded from the substrate processing apparatus 10 and is transported to the wafer weight measuring apparatus 100. Then, the weight of the wafer W is measured by the wafer weight measuring apparatus 100.

In step S104, the control unit 200 determines whether or not the weight of the wafer W subjected to the film forming processing in step S102 is within the range of a reference value. If the weight of the wafer W is within the range of the reference value (YES in step S104), the processing of the control unit 200 returns to step S102, and a next wafer W is subjected to a film forming processing. If the weight of the wafer W is not within the range of the reference value (NO in step S104), the processing of control unit 200 proceeds to step S105.

In step S105, the control unit 200 raises and resets the set temperature (heating temperature) of the heater 30. By raising the set temperature, the amount of vaporization of the solid raw material M in the raw material container 21 increases.

In step S106, the control unit 200 performs a film forming processing on the wafer W. Specifically, the wafer W before the film forming processing is transported to the substrate processing apparatus 10 and is placed on the stage 12. The control unit 200 controls the heater 30 to the predetermined set temperature, and controls the upstream side valve 61, the downstream side valve 62, the mass flow controller 54, and the mass flow controller 56 to supply the mixed gas of the carrier gas and the raw material gas from the raw material supply apparatus 20 into the processing container 11. Thus, the wafer W is subjected to the film forming processing.

In step S107, the control unit 200 measures the weight of the wafer W subjected to the film forming processing in step S106. Specifically, the wafer W subjected to the film forming processing is unloaded from the substrate processing apparatus 10 and is transported to the wafer weight measuring apparatus 100. Then, the weight of the wafer W is measured by the wafer weight measuring apparatus 100.

In step S108, the control unit 200 determines whether or not the weight of the wafer W subjected to the film forming processing in step S106 is within the range of the reference value. If the weight of the wafer W is within the range of the reference value (YES in step S108), the processing of the control unit 200 returns to step S102, and a next wafer W is subjected to a film forming processing. If the weight of the wafer W is not within the range of the reference value (NO in step S108), the processing of control unit 200 proceeds to step S109.

In step S109, the control unit 200 determines that the raw material container 21 is to be replaced. Then, the control unit 200 instructs an operator to replace the raw material container 21.

Although it has been described that it is determined in steps S104 and S108 whether or not the weight of the wafer W subjected to the film forming processing is within the range of the reference value, the present disclosure is not limited thereto. For example, before the film forming processing (steps S102 and S106), the wafer weight measuring apparatus 100 may measure the weight of the wafer W before the film forming process in advance. Then, in steps S104 and S108, the control unit 200 may be configured to determine whether or not the weight difference between the weight of the wafer W before the film forming processing is performed and the weight of the wafer W after the film forming processing is performed is within the range of a reference value.

Next, the gas management method of the substrate processing system 1 according to the present embodiment and a gas management method of the substrate processing system 1 according to a reference example will be described in comparison with each other.

Figure 5:
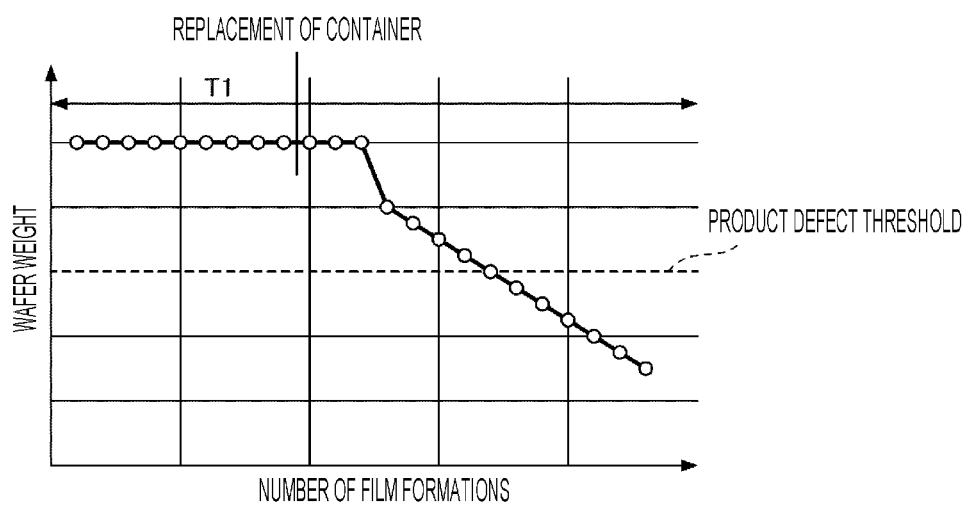
FIG. 5 is an example of a graph illustrating a relationship between the number of film formations and the wafer weight in the gas management method of the substrate processing system according to a reference example.

FIG. 5 is an example of a graph illustrating a relationship between the number of film formations (the number of wafers W subjected to the film forming processing) and the wafer weight in the gas management method of the substrate processing system 1 according to a reference example. The horizontal axis indicates the number of film formations, and the vertical axis indicates the wafer weight. Further, in the gas management method of the substrate processing system 1 according to the reference example, the set temperature of the heater 30 is kept constant at a temperature T1.

As the number of film formations increases and the raw material M in the raw material container 21 is consumed, the amount of vaporization of the raw material M decreases and the supply amount of the raw material gas decreases. Therefore, the film thickness of a film formed on the wafer W decreases, and the weight of the wafer W after the film forming processing changes. Further, with a decrease in the supply amount of the raw material gas, a coverage defect occurs. Therefore, the coverage defect may be estimated from the weight of the wafer W after the film forming processing. In FIG. 5, the broken line indicates a threshold (product defect threshold) at which the coverage defect occurs on the wafer W after the film forming processing.

Further, the substrate processing system 1 heats the solid raw material M in the raw material container 21 to generate the raw material gas, and supplies the carrier gas to the raw material container 21, thereby supplying the mixed gas of the raw material gas and the carrier gas to the processing container 11. Therefore, it is difficult for the substrate processing system 1 to control the flow rate of the raw material gas supplied from the raw material container 21. That is, it is difficult to calculate the consumption of the raw material gas.

Therefore, in the gas management method of the substrate processing system 1 according to the reference example, in order to prevent the coverage defect (product defect), once a certain period of time (predetermined number of film formations) has elapsed after the use of the raw material container 21 is started, the raw material container 21 is replaced, thereby preventing the coverage defect (product defect) due to the lack of the raw material gas. However, the gas management method of the substrate processing system 1 according to the reference example results in the increased cost since the raw material container 21 is replaced even though the raw material M remains in the raw material container 21.

Figure 6:
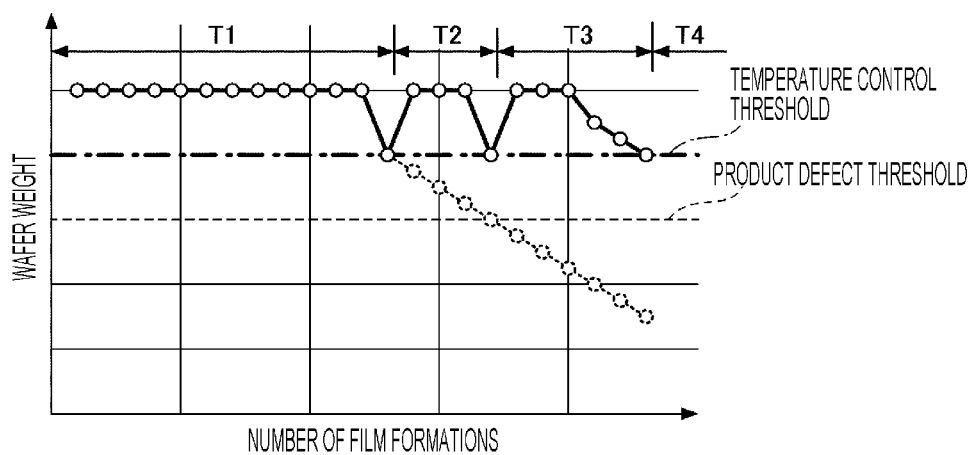
FIG. 6 is an example of a graph illustrating a relationship between the number of film formations and the wafer weight in the gas management method of the substrate processing system according to the present embodiment.

FIG. 6 is an example of a graph illustrating a relationship between the number of film formations (the number of wafers W subjected to the film forming processing) and the wafer weight in the gas management method of the substrate processing system 1 according to the present embodiment. The horizontal axis indicates the number of film formations, and the vertical axis indicates the wafer weight. In FIG. 6, the dotted line indicates the graph of the relationship between the number of film formations and the wafer weight in the gas management method according to the reference example.

As the number of film formations increases and the raw material M in the raw material container 21 is consumed, the amount of vaporization of the raw material M decreases and the supply amount of the raw material gas decreases. Therefore, the film thickness of a film formed on the wafer W decreases, and the weight of the wafer W after the film forming processing changes. When the weight of the wafer W becomes equal to or less than a predetermined threshold (temperature control threshold indicated by the dashed line in FIG. 6), the control unit 200 raises the set temperature (heating temperature) of the heater 30 from the temperature T1 to a temperature T2 (T2>T1) (see S105). Thus, the amount of vaporization of the raw material M increases, and a decrease in the supply amount of the raw material gas is prevented. Further, the film forming processing may be continued while preventing a product defect due to coverage deterioration.

When the number of film formations increases, and at the set temperature T2, the weight of the wafer W becomes equal to or less than the predetermined threshold (temperature control threshold), the control unit 200 raises the set temperature of the heater 30 from the temperature T2 to a temperature T3 (T3>T2) (see S105). Thus, the amount of vaporization of the raw material M increases, and a decrease in the supply amount of the raw material gas is prevented. Further, the film forming processing may be continued while preventing a product defect due to coverage deterioration.

Similarly, when the number of film formations increases, and at the set temperature T3, the weight of the wafer W becomes equal to or less than the predetermined threshold (temperature control threshold), the control unit 200 raises the set temperature of the heater 30 from the temperature T3 to a temperature T4 (T4>T3). Thus, the amount of vaporization of the raw material M increases, and a decrease in the supply amount of the raw material gas is prevented. In addition, the film forming processing may be continued while preventing a product defect due to coverage deterioration.

Further, if the weight of the wafer W does not reach the threshold (temperature control threshold) even though the set temperature (heating temperature) of the heater 30 is raised (see NO in step S108), it is determined that the raw material container 21 is to be replaced (step S109). It may be determined that the raw material container 21 is to be replaced if the set temperature reaches a predetermined temperature.

As described above, with the gas management method of the substrate processing system 1 according to the present embodiment, it is possible to prevent a product defect (coverage defect) due to the lack of the raw material gas. Further, since the raw material M in the raw material container 21 may be used efficiently, it is possible to reduce the cost of the raw material gas. Further, it is possible to reduce man-hours by the replacement of the raw material container 21.

The control unit 200 may continuously accumulate correlation data between the weight of the wafer W and the measured values of the upstream side pressure gauge 71 and the downstream side pressure gauge 72. Then, the control unit 200 may estimate the weight of the wafer W after the film forming processing based on the correlation data with the measurement values of the upstream side pressure gauge 71 and the downstream side pressure gauge 72. Further, the control unit 200 may control the set temperature (heating temperature) of the heater 30 based on the estimated weight of the wafer W after the film forming processing. Further, the control unit 200 may determine the replacement timing of the raw material container 21 based on the estimated weight of the wafer W after the film forming processing. Thus, after the correlation data is created, it is possible to omit the weight measurement of the wafer W after the film forming processing by the wafer weight measurement apparatus 100.

According to one aspect, it is possible to provide a gas management method and a substrate processing system for managing a raw material gas supplied to a substrate processing apparatus.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing system comprising:
    a processing container that accommodates a substrate;
    a raw material supply including a raw material container configured to accommodate a raw material and a heater configured to heat the raw material container in order to supply a vaporized raw material gas together with a carrier gas to the processing container; and
    a controller configured to measure a first weight of the substrate after a processing on the substrate while heating the raw material container to a first predetermined temperature by the heater, control a temperature of the heater to a second predetermined temperature that is higher than the first predetermined temperature when the first weight of the substrate after the processing at the first predetermined temperature becomes equal to or less than a threshold value, measure a second weight of the substrate after a processing on the substrate while heating the raw material container to the second predetermined temperature by the heater, and instruct an operator of the substrate processing system to replace the raw material container when the second weight of the substrate after the processing at the second predetermined temperature is equal to or less than the threshold value.

2. The substrate processing system according to claim 1, wherein the raw material accommodated in the raw material container is a solid raw material or a liquid raw material.

3. The substrate processing system according to claim 1, further comprising:
    a carrier gas supply configured to supply the carrier gas to the raw material container;
    an upstream path connecting the carrier gas supply and the raw material container to each other and including an upstream side pressure gauge;
    a supply path connecting the processing container to the raw material supply; and
    a downstream path connecting the raw material supply and the supply path to each other and including a downstream side pressure gauge,
    wherein the controller estimates the weight of the substrate after the processing of the substrate based on correlation data with measured values of the upstream side pressure gauge and the downstream side pressure gauge.

4. The substrate processing system according to claim 1, wherein the controller performs the processing on a next substrate while heating the raw material container to the first predetermined temperature by the heater when the first weight of the substrate exceeds the threshold value.

5. The substrate processing system according to claim 1, wherein the controller performs the processing on a next substrate while heating the raw material container to the first predetermined temperature by the heater when the second weight of the substrate exceeds the threshold value.

6. A substrate processing system comprising:
    a processing container that accommodates a substrate;
    a raw material supply including a raw material container configured to accommodate a raw material and a heater configured to heat the raw material container in order to supply a vaporized raw material gas together with a carrier gas to the processing container; and
    a controller configured to measure a first weight of the substrate before a processing on the substrate while heating the raw material container to a first predetermined temperature by the heater, control a temperature of the heater to a second predetermined temperature that is higher than the first predetermined temperature when the first weight of the substrate becomes equal to or less than a threshold value, measure a second weight of the substrate before a processing on the substrate while heating the raw material container to the second predetermined temperature by the heater, and instruct an operator of the substrate processing system to replace the raw material container when the second weight of the substrate is equal to or less than the threshold value.

7. A substrate processing system comprising:
    a processing container that accommodates a substrate;

a raw material supply including a raw material container configured to accommodate a raw material and a heater configured to heat the raw material container in order to supply a vaporized raw material gas together with a carrier gas to the processing container; and a controller configured to measure a first weight of the substrate before a first processing on the substrate while heating the raw material container to a first predetermined temperature by the heater, measure a second weight of the substrate after the first processing on the substrate, control a temperature of the heater to a second predetermined temperature that is higher than the first predetermined temperature when a weight difference between the first weight of the substrate and the second weight of the substrate is outside a range of a reference value, measure a third weight of the substrate before a second processing on the substrate while heating the raw material container to the second predetermined temperature by the heater, measure a fourth weight of the substrate after the second processing on the substrate, and instruct an operator of the substrate processing system to replace the raw material container when a weight difference between the third weight of the substrate and the fourth weight of the substrate is outside the range of the reference value.

* * * * *